United States Patent [19]
Hon et al.

[11] 4,064,408
[45] Dec. 20, 1977

[54] METHOD AND APPARATUS FOR DETECTION OF WAVEFORM PEAKS AND SLOPES

[75] Inventors: Wai-Leung Hon; Henry B. Patterson, Jr., both of Houston, Tex.

[73] Assignee: Texas Instruments Incorporated, Dallas, Tex.

[21] Appl. No.: 216,753

[22] Filed: Jan. 10, 1972

Related U.S. Application Data

[63] Continuation of Ser. No. 126, Jan. 2, 1970, abandoned.

[51] Int. Cl.² .................................................. H03K 5/153
[52] U.S. Cl. ...................................... 307/351; 307/358; 328/117; 328/132; 328/150
[58] Field of Search .................. 307/231, 235, 236; 324/77; 328/114–118, 132, 135, 150, 151

[56] References Cited
U.S. PATENT DOCUMENTS

| | | | |
|---|---|---|---|
| 3,334,298 | 8/1967 | Monrad-Krohn | 328/114 X |
| 3,668,532 | 6/1972 | Potash | 328/151 |

*Primary Examiner*—John Zazworsky
*Attorney, Agent, or Firm*—Rene' E. Grossman; Thomas G. Devine

[57] ABSTRACT

The invention includes directing an analog electrical signal through a plurality of discrete time delays in order to sequentially introduce cumulative time delays to the electrical signal. The magnitudes of the electrical signal before and after the introduction of each of the time delays are compared, and a plurality of pulse signals are generated in response to the comparisons. Logic circuitry is responsive to the logic conditions of the pulse signals to generate output signals indicative of the amplitude peaks or slopes of the electrical signal.

9 Claims, 7 Drawing Figures

INVENTORS:
WAI-LEUNG HON
HENRY B. PATTERSON, JR.

ATTORNEY

METHOD AND APPARATUS FOR DETECTION OF WAVEFORM PEAKS AND SLOPES

This is a continuation of application Ser. No. 126, filed Jan. 2, 1970, and now abandoned.

This invention relates to detection of wave shapes, and more particularly to a method and apparatus for detecting the amplitude peaks or slopes of portions of an analog electrical signal.

It is often desirable to detect with a high degree of accuracy the occurrence of negative or positive amplitude peaks of an electrical signal. Examples are the detection of sonar or radar signals or in the detection of signals from an optical to electrical transducer. As another example, digital data is commonly stored on, and played back from, high resolution magnetic recording media such as magnetic discs. When the recorded data is played back from a magnetic disc, the resulting signal is analog in form due to the inherent characteristics of the magnetic disc. It thus becomes important to be able to accurately detect the amplitude peaks, and in some instances the slope, of the resulting analog signal. However, when digital information is stored on such magnetic discs with high packing densities, a phenomenon known as pulse crowding often occurs, and a given symbol or pulse becomes less resolvable upon playback due to interference of adjacent symbols. Additionally, in many systems the problem of resolution of amplitude peaks of such magnetically stored data is further complicated by the presence of noise.

A number of techniques of peak detection have heretofore been developed which primarily utilize differentiation of an electrical signal followed by axis crossing detection. The use of differentiation in such prior systems generally tends, however, to enhance high frequency noise. In systems with low signal-to-noise ratios, false peak detection may thus occur. Additionally, efforts to threshold condition the input signal generally requires some form of DC reference, thereby rendering certain types of signals undetectable due to pulse crowding and the like. AC coupling at the input of such prior peak detection systems is generally required to accommodate multiplexing a variety of signal sources. This AC coupling results in either distortion and peak shifting due to lack of low frequency response, or results in undesirably long transient recovery times. Moreover, in such prior peak detection systems, the moment of detection is dependent upon the time rate of change of the amplitude. Thus, flattened peaks or unsymmetrical peaks are poorly resolved in time by such systems, and flat or null signal regions are indeterminate and often cause false detection.

In accordance with the present invention, various magnitudes of an input wave are compared with later occurring magnitudes of the wave. Output signals which are representative of the shape of the waves are generated in response to the results of the comparisons.

In accordance with another aspect of the invention, a plurality of time delays are provided to sequentially introduce cumulative time delays to an input analog electrical signal. Circuitry is provided to compare the magnitudes of the electrical signal before and after the introduction of each time delay thereto. Logic circuitry responsive to the outputs of the comparing circuitry generates indications of the shape of selected portions of the electrical signal.

In accordance with yet another aspect of the invention, a plurality of time delay circuits each having an input and an output are connected together to receive an input electrical signal. Comparison circuits are connected to each of the inputs and outputs of the delay circuits for generation of electrical comparison signals representative of a comparison between the signal magnitudes appearing upon the inputs and outputs. Logic circuitry responsive to the comparison signals generates output signals indicative of the shape of portions of the electrical signal.

For a more complete understanding of the present invention and for further objects and advantages thereof, reference is now made to the following description taken in conjunction with the following drawings, in which.

Figure 4:
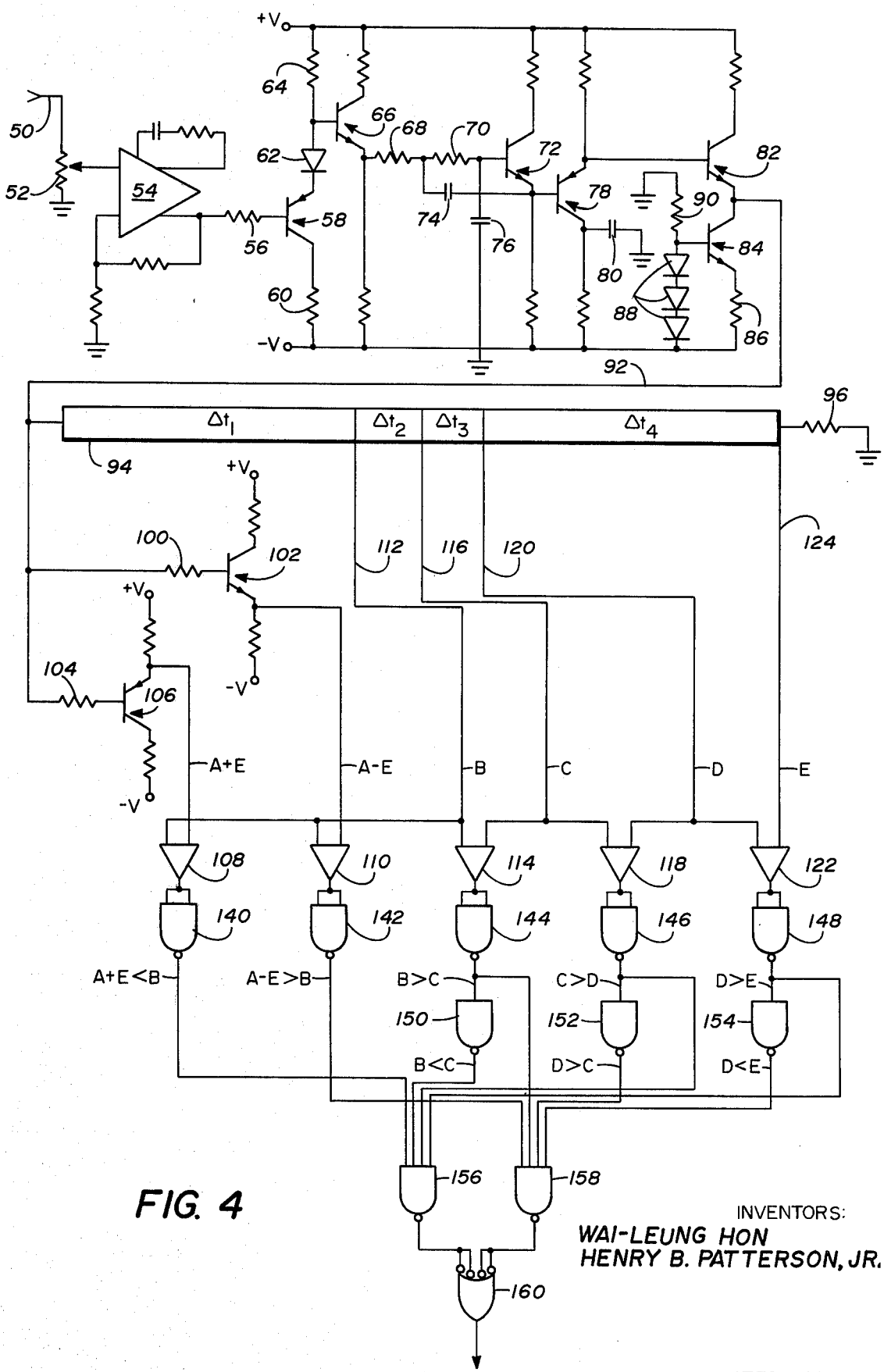
Figure 5:
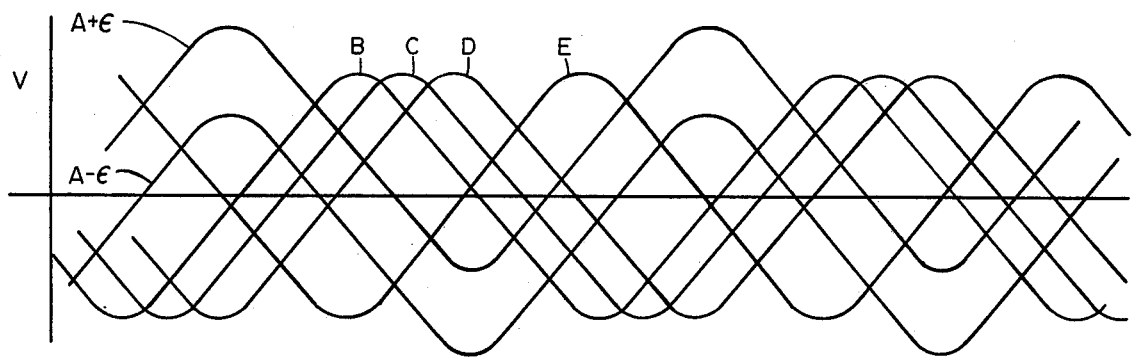
Figure 6:
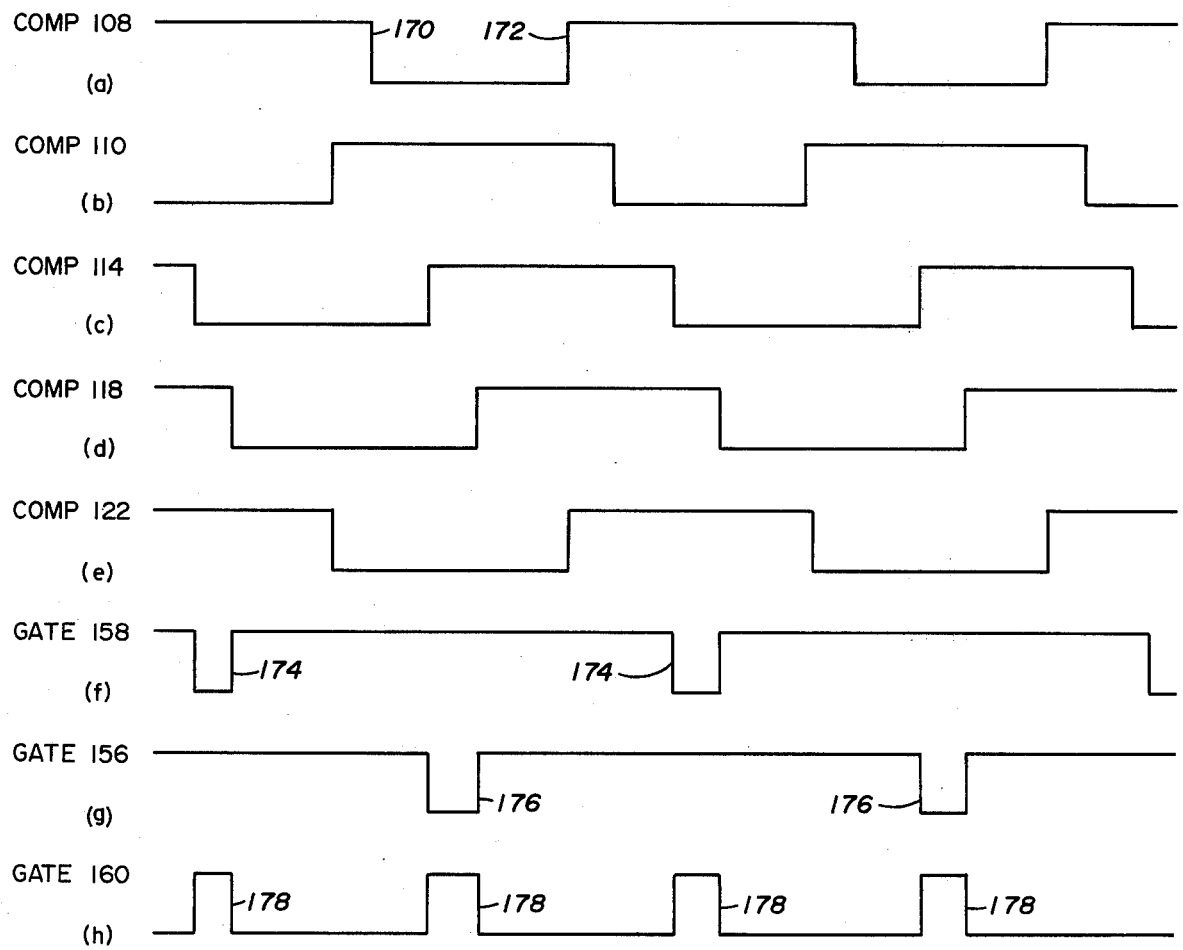
Figure 7:
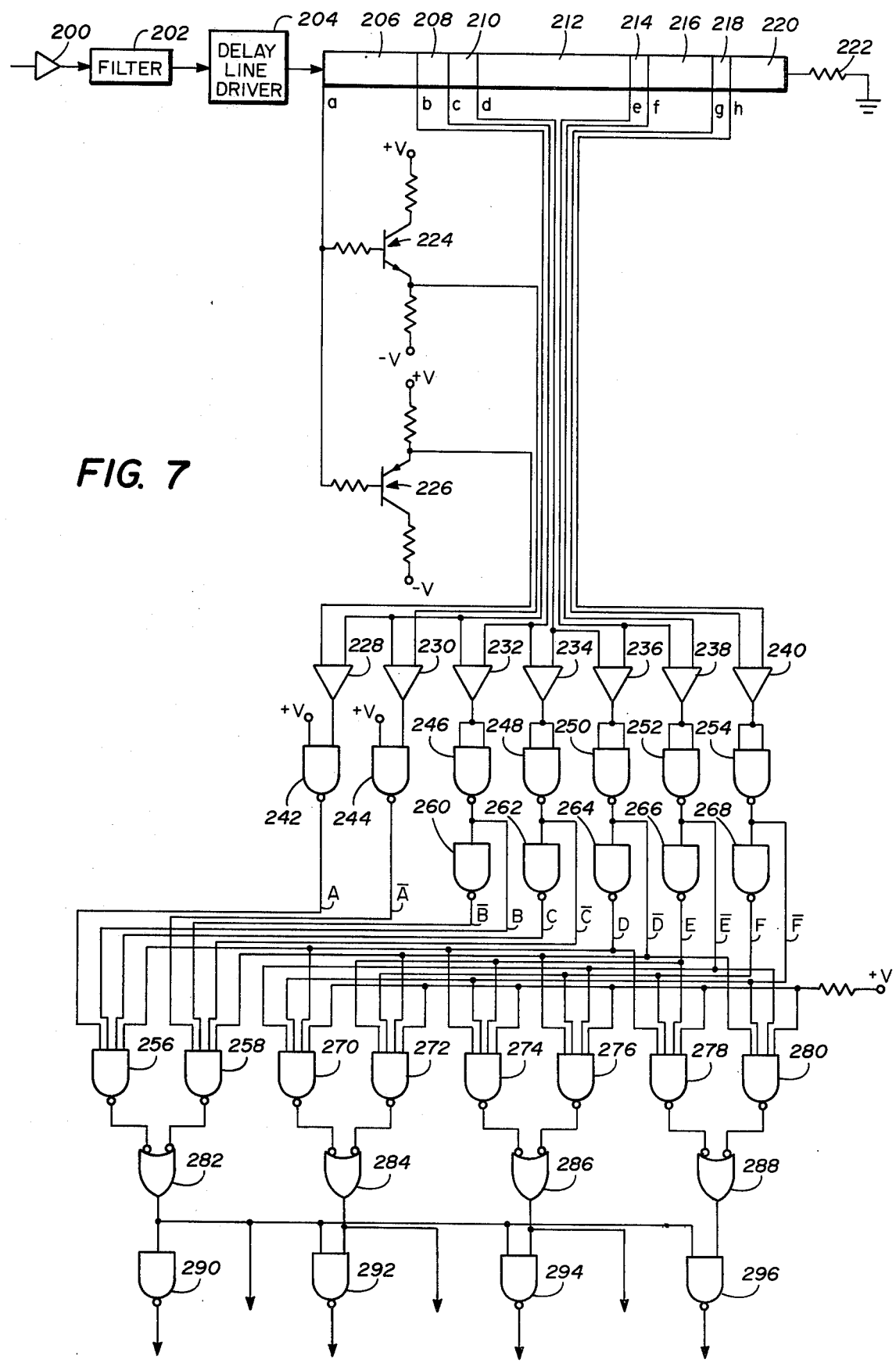

FIGS. 3a–d are diagrammatic waveforms illustrating the theory of operation of the invention;

FIG. 4 is a schematic diagram of one embodiment of a peak detector circuit according to the invention;

FIG. 5 is a graphical representation of the various delayed waveforms provided by the circuit shown in FIG. 4;

FIGS. 6a–h are waveforms taken from various portions of the circuitry shown in FIG. 4; and FIG. 7 is a combined schematic and block diagram of a second embodiment of the invention.

Figure 1:
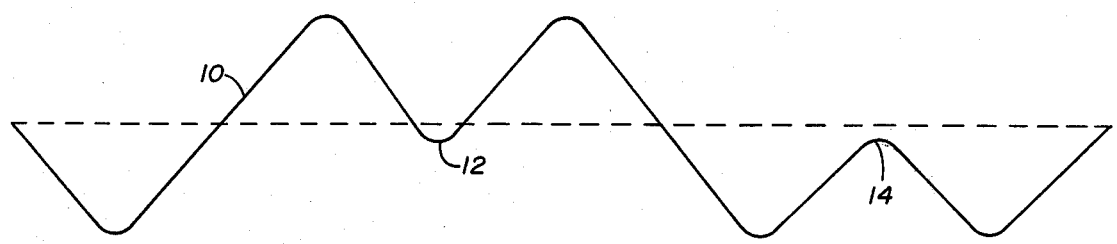
FIG. 1 is a graph illustrating the effect of pulse crowding in a typical high density recording pattern.

Referring to FIG. 1, a waveform 10 is illustrated which is a typical high density magnetic recording playback signal. The signal has been somewhat distorted due to the phenomenon of pulse crowding, and such a waveform presents serious difficulties in detection with the use of previously developed peak detector circuits. For instance, when a prior peak detector circuit is DC referenced, the negative going peak 12 and the positive going peak 14 might not be detected due to their close position to zero voltage. However, with the use of the present invention in the manner to be subsequently described, the detection of such peaks may be accomplished.

A basic aspect of the invention is that an overall portion of the input waveform will be instantaneously inspected by the present system. Such inspection is somewhat analogous to the curve fitting process of the human observer, wherein pulse crowding and noise may be overlooked due to inspection of the waveform as a whole.

The invention envisions delaying the input waveform by a series of cumulative discrete time delays, and comparing the waveforms before and after each time delay. The resulting pulse outputs may then be interpreted according to a prescribed logic code to designate the positive or negative amplitude peaks of the waveform, and in more sophisticated circuitry, to designate the slope of the waveforms.

Figure 2:
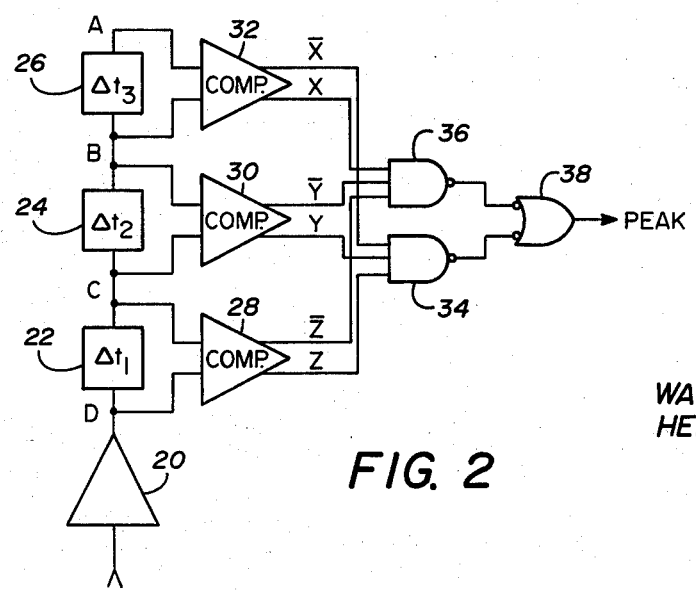
FIG. 2 is a block diagram illustrating the basic operation of the invention.

FIG. 2 illustrates a basic embodiment of the invention in which an input analog electrical signal is fed through an input amplifier 20 and is then directed through three time delays 22, 24 and 26. Amplifier 20 buffers the input signals and drives the time delays. Each of the time delays has an input and an output which is connected to a voltage comparator circuit. Thus, the input and output of the time delay 22 are connected to the inputs of a comparator 28, while the input and output of time delay circuit 24 are connected to a comparator 30. Similarly, the input and output of the time delay circuit 26 are connected to the inputs of the comparator circuit 32. The delays $\Delta t_1$, $\Delta t_2$ and $\Delta t_3$ must be particularly chosen for a given flux change rate of the input signal.

The outputs of the comparator circuit 28 are designated as Z and $\overline{Z}$, while the outputs of the comparator circuit 30 are designated as Y and $\overline{Y}$. The outputs of the comparator circuit 32 are similarly designated X and $\overline{X}$. The Z, Y and $\overline{X}$ comparator circuit outputs are fed into the inputs of a three input NAND gate 34. The $\overline{Z}$, $\overline{Y}$ and X comparator circuit inputs are fed to a three input NAND gate 36. The outputs from gates 34 and 36 are fed to the inputs of a two input buffer NOR gate 38. The output of gate 38 provides a predetermined output signal upon the occurrence of an amplitude peak in the input analog electrical signal.

FIGS. 3a–d assist in the understanding of the operation of the circuit shown in FIG. 2. Referring to FIG. 3a, a positive peak is illustrated, with points A, B, C and D being designated thereon. If the waveform shown in FIG. 3a is input into the system of FIG. 2, point A of the waveform will be delayed for an analog time delay $\Delta t_1 + \Delta t_2 + \Delta t_3$. Point B would then have been delayed an analog time delay $\Delta t_1 + \Delta t_2$, while point C would have been delayed by $\Delta t_1$. Point D will not have been delayed.

Due to the fact that the waveform shown in FIG. 3a is a positive peak, point B will have a greater amplitude than point A, and thus an indication will appear at output X of the comparator circuit 32. Additionally, point B at the moment of comparison is equal to and will become greater than point C, and thus an indication is generated upon the $\overline{Y}$ output of the comparator circuit 30. Moreover, point C has a greater magnitude than point D, and thus an indication is generated upon the $\overline{Z}$ output of the comparator circuit 28. It may thus be seen that the logic condition for the case of a positive peak is X $\overline{Y}$ $\overline{Z}$. When this condition is sensed by the gate 36, a pulse signal is fed to gate 38 to indicate the occurrence of an amplitude peak. If desired, an output could then be taken directly from the gate 36 to indicate the occurrence of a positive peak.

In a similar manner, when a waveform having a negative peak, as illustrated in FIG. 3b, is fed into the circuit shown in FIG. 2, the points A, B and C on the waveform will again be delayed by the delay circuits. The comparator circuits 28, 30 and 32 again compare the relative voltage magnitudes at points A, B, C and D. Referring to FIG. 3b, it will be seen that the logic condition for the occurrence of a negative peak is $\overline{X}$ Y Z. When this condition is sensed by the gate 34, an indication is provided to the gate 38 to denote the occurrence of a negative voltage peak.

Referring to FIG. 3c, a positive going wave slope is illustrated. It may be seen that the logic condition for the case of such a slope is given by X Y Z. Similarly, FIG. 3d illustrates a negative going voltage slope, wherein it may be seen that the logic condition for this case is $\overline{X}$ $\overline{Y}$ $\overline{Z}$. With the addition of additional logic circuitry to the system shown in FIG. 2, output signals may be generated to indicate the presence of such slopes. As will be described later in more detail, this slope information is useful in monitoring the status of the input waveform, and the information may be used in a more complex configuration to demodulate the input waveform.

Figure 3:
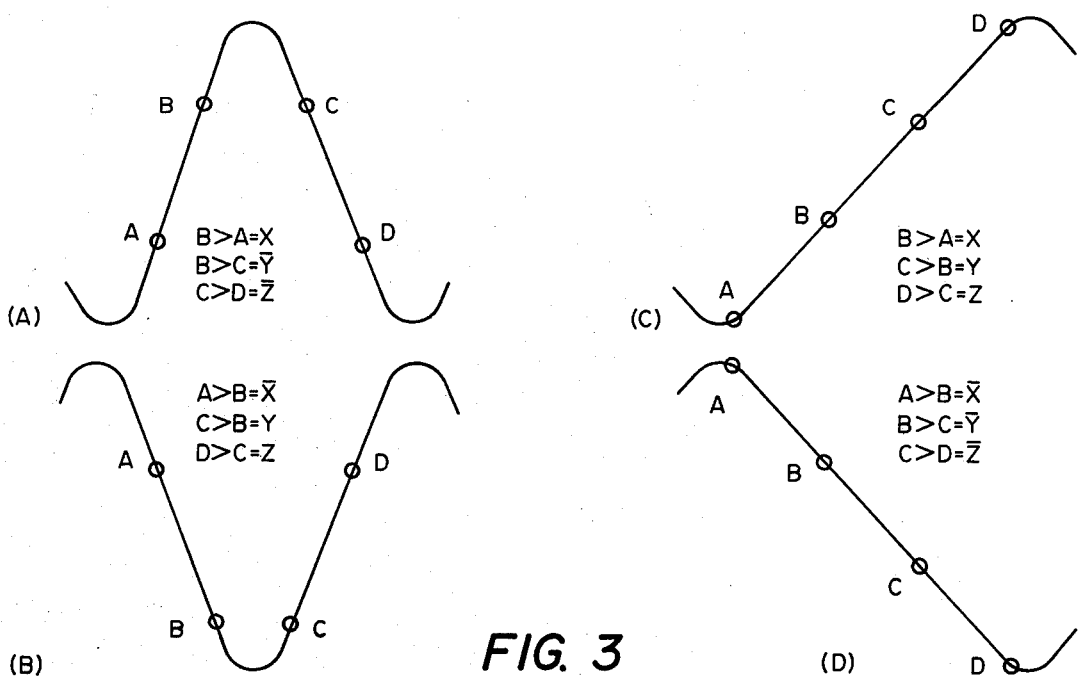

The present invention is not limited to the use of the simple four point curve fitting technique illustrated in FIGS. 2 and 3, and more complex multiple point curve fitting systems may be utilized to provide additional accuracy and resolution. With optimazation of time delays for particular waveforms, discrimination against high frequency noise may be obtained by the circuit. The present invention is particularly advantageous in that the curve fitting techniques are not dependent upon the mean or absolute DC value of the input waveform voltage. For example, the comparators determine which of the input voltages is greater regardless of the DC level of either of the input voltages.

A more complex system utilizing the invention is illustrated in FIG. 4. The input analog electrical signals are fed into an input terminal 50 and are fed through an adjustable voltage divider 52 to an input of an amplifier 54. A suitable amplifier for use in this circuit is the SN5511 Amplifier manufactured and sold by Texas Instruments Incorporated of Dallas, Texas. The output from amplifier 54 is fed through a resistance 56 to the base of a transistor 58. The collector of transistor 58 is connected through a resistance 60 to a source of negative voltage, while the emitter of transistor 58 is connected through a diode 62 and a resistance 64 to a positive source of voltage. The anode of diode 62 is connected to the base of a transistor 66. Transistors 58 and 66 operate as a buffer stage.

The output from the emitter follower connected transistor 66 is fed through resistances 68 and 70 to the base of an emitter follower connected transistor 72. A capacitor 74 is connected between resistances 68 and 70 and the emitter of transistor 72. A capacitor 76 is connected between the base of transistor 72 and circuit ground. The emitter of transistor 72 is connected to the base of a transistor 78. The collector of transistor 78 is connected through a capacitor 80 to circuit ground. The transistor 72 and 78 and their associated circuitry comprise a low pass filter and buffer which cuts off high frequency noise in the region of 20MHz.

The filtered signal is fed to the base of a transistor 82, the emitter of which is connected to the collector of a transistor 84. The emitter of transistor 84 is connected through resistance 86 to a series of diodes 88. The base of transistor 84 is connected to the anode of the last diode 88 and is also connected through a resistance 90 to circuit ground. Transistor 84 and its associated circuitry comprises a generally constant current source for the transistor 82. Transistor 82 comprises a driver circuit for the following circuitry and has a low output impedance for matching with the following delay line.

The emitter of transistor 82 is connected via a lead 92 to the input of a delay line 94. The delay line 94 comprises a plurality of discrete delay elements to provide time delays $\Delta t_1$, $\Delta t_2$, $\Delta t_3$ and $\Delta t_4$. The delay line 94 is terminated in a low resistance 96 which is connected to ground. In practice, a suitable delay line for use with the invention was the Valor Model DL1322 delay line. This delay line was connected in a typical application to provide a time delay $\Delta t_1$ of 110 nanoseconds, a $\Delta t_2$ of 40 nanoseconds, a $\Delta t_3$ of 40 nanoseconds and a $\Delta t_4$ of 110 nanoseconds. However, these time delays may be varied for use with different applications.

The output from transistor 82 is also connected via lead 92 and through a resistance 100 to the base of a transistor 102. Additionally, the output from transistor 82 is connected via lead 92 and through a resistance 104 to the base of a transistor 106. Transistors 102 and 106 are connected in conventional emitter follower configuration. The emitter of transistor 106 is fed to an input of a voltage comparator 108. The emitter of transistor 102 is fed to an input of a voltage comparator 110. The purpose of transistor 106 is to bias the DC level of the input electrical signal up one $V_{BE}$, while the transistor 102 biases the DC level of the input signal down one $V_{BE}$ drop. The $V_{BE}$ drop is designated as $\epsilon$ and in a practical embodiment may comprise about 0.6 volt. The DC shifting of magnitudes other than 0.6 voltage can be accomplished with a summing amplifier.

The shifting of the DC level of the signal at time reference A allows the peak detector to ignore signals that are below a certain amplitude, depending upon the magnitude of the shift. The signals may be below the amplitude due to a bad recording head encountered, or the like. In this case, no peak detection is indicated by the detector instead of providing incorrect peak detection. The input signal is delayed by the delay line 94 by the time interval $\Delta t_1$ and is fed via lead 112 to the input of a voltage comparator 114, and also to the second inputs of comparator circuits 108 and 110. The signal is then delayed additionally by the time interval $\Delta t_2$ and is fed via lead 116 to voltage comparator circuits 114 and 118. The signal is delayed further by a time interval $\Delta t_3$ and is fed via lead 120 to the second input of the voltage comparator circuit 118 and also to the input of a voltage comparator circuit 122. The final time delay interval of $\Delta t_4$ is applied to the input signal and the resulting delayed signal is fed via lead 124 to the second input of the voltage comparator circuit 122.

The operation of the circuit of FIG. 4 may be best understood by reference to the waveforms shown in FIGS. 5 and 6. FIG. 5 illustrates the various DC level shifted waveforms and delayed waveforms present in the circuit of FIG. 4. The undelayed waveform is designated $A+\epsilon$ and represents the voltage at the emitter of transistor 196. The undelayed waveform which has its DC level shifted downwardly by transistor 102 is designated $A-\epsilon$. Waveform B is delayed from the input waveform by a time interval $\Delta t_1$ and is a waveform appearing on lead 112. Waveform C is delayed from waveform B by a time interval $\Delta t_2$ and appears on lead 116. Waveform D is delayed from waveform C by the time delay interval $\Delta t_3$ and appears upon lead 120. Waveform E is delayed from waveform D by the time interval $\Delta t_4$ and appears upon the lead 124.

The voltage comparators 108–122 may comprise, for instance, the SN72710N Comparators manufactured and sold by Texas Instruments Incorporated of Dallas, Tex. The output of comparator 108 is fed to both inputs of a two input NAND gate 140, while the outputs of comparator circuits 110 and 114 are respectively applied to both inputs of two input NAND gates 142 and 144. Similarly, the outputs of comparator circuits 118 and 122 are respectively connected to the inputs of NAND gates 146 and 148. An output appearing from gate 140 is representative of $A+\epsilon$ being less than B at the time of comparison, while an output appearing from the gate 142 is representative of $A-\epsilon$ being greater than B at the time of comparison. The output appearing from gate 144 is representative of B being greater than C, while an output appearing from gate 146 is representative of C being greater than D. The output appearing from gate 148 is representative of D being greater than E.

The output from gate 144 is fed to both inputs of a two input NAND gate 150, the output of which is then representative of waveform B being less than waveform C at the time of comparison. The output of gate 146 is fed to both inputs of the NAND gate 152, the output of which is representative of the waveform D being greater than waveform C. The output of gate 148 is fed to both inputs of a NAND gate 154, the output of which is representative of waveform D being less than waveform E. The NAND gates 140–154 may comprise, for instance, the SN74H00N gates manufactured and sold by Texas Instruments Incorporated of Dallas, Tex.

The outputs from gates 140, 150, 146 and 148 are fed to the inputs of a four input NAND gate 156. The outputs of gates 142, 144, 152 and 154 are fed to the inputs of a four input NAND gate 158. Gates 156 and 158 may comprise for instance, the SN74H20N gates manufactured and sold by Texas Instruments Incorporated of Dallas, Tex. An output from gate 156 is representative of the occurrence of a positive amplitude peak occurring in the input analog electrical signal. The output from gate 158 is representative of the occurrence of a negative amplitude voltage occurring in the input signal.

The outputs from gates 156 and 158 are fed to the inputs of a four input buffer NOR gate 160, which may comprise for instance the SN74H40N gate manufactured by Texas Instruments Incorporated. The output pulses from gate 160 are thus representative of the occurrence of either positive or negative going peaks in the input waveform. The indications output from gate 160 will generally be delayed from the occurrence of peaks in the analog input signal, as for example, in the range of about 200 nanoseconds in the embodiment shown.

FIG. 6, taken in conjunction with FIG. 5, aids in the understanding of the circuit shown in FIG. 4. The waveforms shown in FIGS. 6a–e are illustrative of the logical pulse outputs appearing at the outputs of the comparators 108–122. The pulse outputs are aligned in time with the various waveforms illustrated in FIG. 5. Thus, the pulse shown in FIG. 6a goes negative at 170 when the waveform $A+\epsilon$ becomes less than waveform B. Likewise, the positive going portion 172 of the pulse shown in FIG. 6a occurs when the waveform $A+\epsilon$ becomes greater than B. The output pulses shown in FIGS. 6b–e are likewise aligned in time with the waveforms shown in FIG. 5.

FIGS. 6f–g illustrate the outputs of gates 158 and 156. A logical zero 174 occurs at the output of gate 158 upon the occurrence of a negative peak in the input signal, the indication being delayed in time from the actual occurrence of the peak in the input waveform. Likewise, the output of gate 156 provides logical zeros 176 upon the occurrence of positive peaks in the input waveform. The output of gate 160 as shown in FIG. 6h generates logical ones 178 upon the occurrence of either negative or positive going amplitude peaks of the input waveform.

Referring to FIG. 7, a system is illustrated which provides indications of both the occurrence of amplitude peaks and waveform slopes of an input analog electrical signal. The electrical signals, which for instance may comprise the playback signal from a magnetic recording disc, is fed through an amplifier 200 similar to that described in FIG. 4. The amplified signal is then fed through a filter 202 also similar to that previously described in order to filter out high frequency noise.

The filtered signal is then fed through a delay line driver 204 which is divided into different discrete time delay sections 206–220. The delay line is terminated in a low resistance 222. In the illustrated embodiment, the Valor DL1322 and Valor N100R5-15/1 delay lines were advantageously utilized. While different delay intervals will be utilized for different applications, in the particular embodiment illustrated, 100 nanosecond delays were provided for delay time intervals 206 and 216, while 40 nanosecond delays were provided for delay intervals 208 and 210. A 200 nanosecond delay was provided for the time delay interval 212.

The input waveform is also applied to the bases of transistors 224 and 226 in order to shift the DC level of the input waveform up and down, in the manner previously described, to provide the function previously described. The emitters of transistors 224 and 226 are applied to inputs of voltage comparators 228 and 230. The various delayed signals passing through the delay line are respectively applied to the inputs of comparators 228-240 in the manner illustrated. The outputs from the comparators 228-240 are respectively applied to a series of NAND gates 242-254.

The output from gate 244 is labeled A and is fed to an input of a NAND gate 256. The output of gate 244 is labeled $\overline{A}$ and is fed to an input of a NAND gate 258. The output of gate 246 is labeled B and is applied to a gate 260 which produces an output labeled $\overline{B}$. The output of gate 248 is labeled $\overline{C}$ and is applied to the gate 262 which produces an output labeled C. The output of 250 is labeled $\overline{D}$ and is applied through a gate 264 to produce an output labeled D. The output of gate 252 is labeled $\overline{E}$ and is applied to the gate 266 which produces an output E. The output of gate 254 is labeled $\overline{F}$ and is applied to a gate 268 which produces an output F.

The four input NAND gate 256 is connected to receive the outputs A, B, C and D. The gate 258 is connected to receive the outputs $\overline{A}, \overline{B}, \overline{C}$ and $\overline{D}$. A gate 270 is connected to receive outputs $\overline{E}, \overline{F}$ and D. A NAND gate 272 is connected to receive the outputs E, F, and $\overline{D}$. A gate 274 is connected to receive the outputs D, $\overline{F}$ and E, while a gate 276 is connected to receive the outputs $\overline{D}$, F, and $\overline{E}$. A NAND gate 278 is connected to receive the outputs D, F and E, while a NAND gate 280 is connected to receive the outputs $\overline{D}, \overline{F}, \overline{E}$. The unused inputs of the various four input NAND gates are tied together and connected to a supply voltage through a resistor.

The outputs from gates 256 and 258 are connected to the inputs of a NOR gate 282, while the outputs of gates 270 and 272 are connected to the inputs of the NOR gate 284. The outputs of gates 274 and 276 are connected to a NOR gate 286, while the outputs of gates 278 and 280 are connected to the inputs of a NOR gate 288. It will be seen that a portion of the circuitry shown in FIG. 7 is similar to that shown in FIG. 4, such that the output of gate 256 is representative of one polarity of a positive peak and the output of gate 258 is representative of the opposite polarity amplitude peak. The output of gate 282 is fed to a NAND gate 290 which produces a pulse output upon the occurrence of each amplitude peak of the input waveform.

The remaining portion of the logic circuitry produces indications of the slope of the input electrical analog signal. Due to many recording techniques, the pulses occurring in the playback of magnetic recording discs will often be separated from one another by variation of time delays. In the system illustrated, the input signal will include peaks separated from one another by either about 200 nanoseconds, 300 nanoseconds or about 400 nanoseconds. To assist in later demodulation and use of the input signals, the present circuit provides information regarding the relative slope between the detected peaks. Use of this modulation system enables ease in AC coupling of amplifiers, as well as a narrow bandwidth.

Thus, the outputs of gates 270 and 272 are representative respectively of positive and negative slopes of the input wave between peaks occurring at about 200 nanoseconds from one another. The output of gate 284 is fed to an input of a NAND gate 292 to produce an output representative of a spacing between adjacent amplitude peaks of approximately 200 nanoseconds. Similarly, the outputs of gates 274 and 276 indicate either positive or negative slopes between amplitude peaks occurring at about 300 nanoseconds from one another, with the output of gate 286 being connected to a gate 294 to produce indications of amplitude peaks occurring at about 300 nanoseconds apart. Likewise, the outputs of gates 278 and 280 are representative of either positive or negative going slopes between wave peaks occurring about 400 nanoseconds from one another. The output of gate 288 is applied to a gate 296 in order to provide an indication of the occurrence of amplitude peaks occurring at about 400 nanoseconds from one another.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A system for providing a digital representation of an input analog waveform, comprising:
   a. a plurality of comparator means for comparing various magnitudes of said analog waveform with later occurring magnitudes thereof;
   b. first logic means responsive to the outputs of said comparator means according to a first prescribed logic code to indicate the occurrence of a positive wave peak; and
   c. second logic means responsive to the outputs of said comparator means according to a second prescribed logic code to indicate the occurrence of a negative wave peak.

2. The system of claim 1 further comprising a plurality of time delay means sequentially connected to successively delay the respective input signals to said plurality of comparator means.

3. The system of claim 2 further comprising a driver amplifier connected to precede said plurality of time delay means.

4. The system of claim 2 wherein said plurality of time delay means is comprised of a delay line having a plurality of output terminals each representing a different time delay.

5. The combination of claim 1 further comprising third logic means connected to the outputs of said first and second logic means to indicate the occurrence of a wave peak.

6. The combination of claim 1 further comprising noise reduction means connected to the input of at least one of said comparator means for shifting the d.c. voltage level of said analog waveform.

7. The system of claim 1 further comprising:
   a. third logic means responsive to the outputs of said comparator means according to a third prescribed logic code to provide a logic pulse to indicate the occurrence of a positive wave slope; and
   b. fourth logic means responsive to the outputs of said comparator means according to a fourth prescribed logic code to provide a logic pulse to indicate the occurrence of a negative wave slope.

8. A system for determining the wave shape of an analog electrical signal read from a magnetic recording media comprising:
   a. amplifier means connected to receive and amplify said analog electrical signal;
   b. filter means for filtering out high frequency noise from the amplified signal;
   c. time delay means having a plurality of output terminals each representative of a successively increased time delay;
   d. driver means for transmitting the filtered signal through said time delay means;
   e. a plurality of comparator means connected to the output terminals of said time delay means to compare various magnitudes of said electrical signal with later occurring magnitudes thereof and provide logic pulse indications of the results of the comparisons;
   f. first logic means coupled to be responsive to the outputs of said plurality of comparator means according to a first prescribed logic code to indicate the occurrence of a positive wave peak; and
   g. second logic means coupled to be responsive to the outputs of said plurality of comparator means according to a second prescribed logic code to indicate the occurrence of a negative wave peak.

9. The system of claim 8 further comprising third logic means responsive to the outputs of said plurality of comparator means to indicate the time difference between successively occurring wave peaks.

* * * * *